(12) United States Patent
Tzu et al.

(10) Patent No.: US 6,174,801 B1
(45) Date of Patent: Jan. 16, 2001

(54) E-BEAM DIRECT WRITING TO PATTERN STEP PROFILES OF DIELECTRIC LAYERS APPLIED TO FILL POLY VIA WITH POLY LINE, CONTACT WITH METAL LINE, AND METAL VIA WITH METAL LINE

(75) Inventors: San-De Tzu, Taipei; Ching-Shiun Chiu, Kaohsiung; Chia-Hui Lin, Hsin-Chu, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/261,997

(22) Filed: Mar. 5, 1999

(51) Int. Cl.[7] .................................................. H01L 21/4763
(52) U.S. Cl. ............................................................... 438/637
(58) Field of Search ............................ 438/622, 637, 438/638, 639, 675, 700, 738, 740, 744, 640, 641, 642, 278, 947

(56) References Cited

U.S. PATENT DOCUMENTS

| | | | |
|---|---|---|---|
| 4,222,792 | * 9/1980 | Lever et al. ............................. 148/1 |
| 4,315,984 | 2/1982 | Okazaki et al. ..................... 430/296 |
| 4,788,127 | * 11/1988 | Bailey ................................... 430/192 |
| 5,262,354 | 11/1993 | Cote et al. ............................ 437/195 |
| 5,308,721 | 5/1994 | Garofalo et al. ......................... 430/5 |
| 5,378,649 | * 1/1995 | Huang ................................... 437/52 |
| 5,407,785 | 4/1995 | Leroux ................................. 430/312 |
| 5,602,423 | * 2/1997 | Jain ...................................... 257/752 |
| 5,741,624 | 4/1998 | Jeng et al. ............................ 430/312 |
| 5,753,417 | 5/1998 | Ulrich ................................. 430/312 |
| 5,969,805 | * 10/1999 | Johnson et al. ........................ 356/72 |
| 5,976,968 | * 11/1999 | Dai ....................................... 438/622 |

* cited by examiner

*Primary Examiner*—David Nelms
*Assistant Examiner*—David Nhu
(74) *Attorney, Agent, or Firm*—George O. Saile; Stephen B. Ackerman

(57) ABSTRACT

A method is disclosed for employing direct electron beam writing in the lithography used for forming step-profiles in semiconductor devices. The number of steps in the profiles are not limited. An electron beam sensitive resist is formed over a substrate. The resist is then exposed to a scanning electron beam having precise information, including proximity effect correction data, to directly form stair-case-like openings in the resist. The highly accurately dimensioned step-profiles are then transferred into the underlying layers by performing appropriate etchings. The resulting structures are shown to be especially suitable for forming damascene interconnects for submicron technologies.

29 Claims, 5 Drawing Sheets

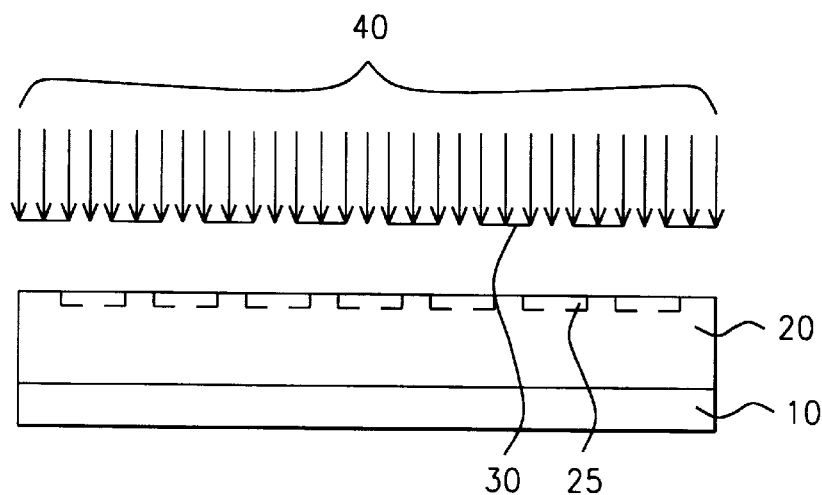
FIG. 1a — Prior Art
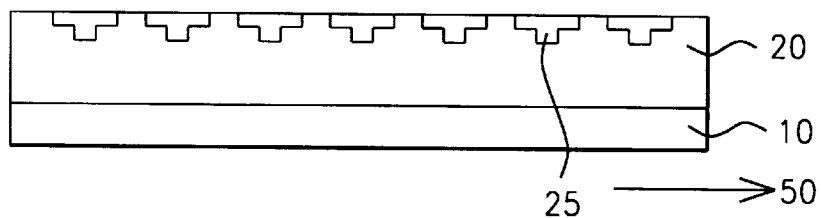
FIG. 1b — Prior Art
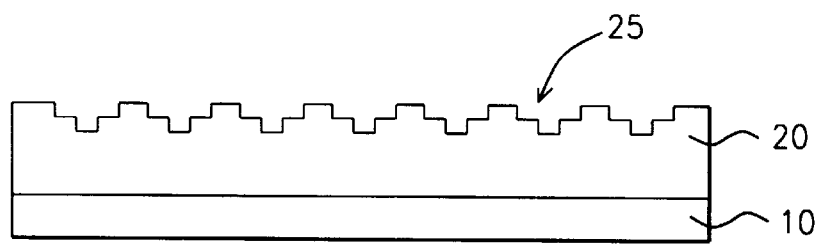
FIG. 1c — Prior Art

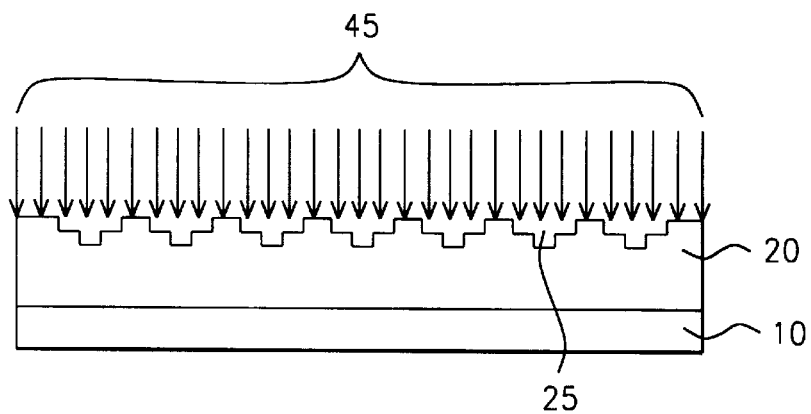
FIG. 1d – Prior Art
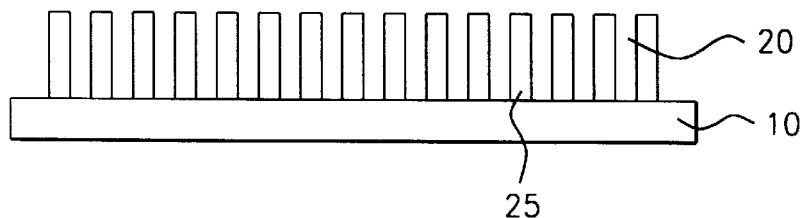
FIG. 1e – Prior Art
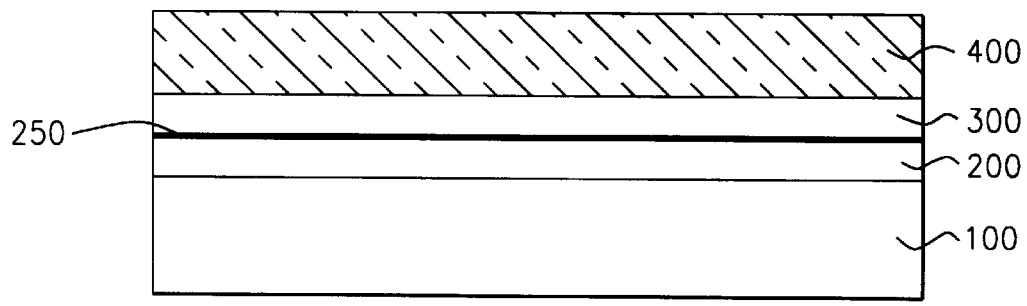
FIG. 2a

E-BEAM DIRECT WRITING TO PATTERN STEP PROFILES OF DIELECTRIC LAYERS APPLIED TO FILL POLY VIA WITH POLY LINE, CONTACT WITH METAL LINE, AND METAL VIA WITH METAL LINE

BACKGROUND OF THE INVENTION (1) Field of the Invention

The present invention relates to the forming of multilevel interconnects in the manufacture of integrated circuits in general, and in particular, to a method of employing electron beam writing in the lithography used for forming such interconnects.

(2) Description of the Related Art

Commensurate with the advances made in the ultra large scale integration (ULSI) of circuits and chips, higher resolution lithography methods are required. As is known in the art, optical lithography is limited to somewhat less than 1 micrometer ($\mu$m) resolution with a registration capability of about ±0.3 $\mu$m. To extend the capability of the lithographic pattern transfer process beyond these limits, alternatives to optical lithography have been developed, including electron beam (e-beam) lithography which offers a resolution of 0.375 $\mu$m with ±0.3 $\mu$m registration. It is disclosed in this invention, a method of employing e-beam lithography judiciously in the forming of densely packed multi-level interconnects.

Conventionally, a semiconductor chip contains one or more metal wiring layers that are separated from each other by an insulating layer and are further separated by still another insulating layer from the devices that are formed near the surface of the semiconductor that forms the base of the chip. The wiring stripes are connected to each other and to the devices at the appropriate places by means of holes that are filled with metal through the insulating layers. The holes that connect the metal lines to each other through the insulating layer are called via holes, while the holes that reach the underlying devices through its insulating layer are called contact holes. Typically, the holes are etched into an insulating layer after the latter has been deposited on the semiconductor substrate on which the chips are fabricated. It is common practice to next blanket deposit metal on the insulating layer thereby filling the holes and then forming the metal lines by etching through a patterned photo resist formed on the metal layer. For the first metal layer, electrical contact is made with the underlying devices through contact holes that allow the metal to descend through the dielectric insulator to the devices. For the second and subsequent wiring layers, the process is repeated and the contact between the metal layers is made through via holes that allow the metal to descend to the lower metal layer(s). It is also common practice to fill the holes separately with metal to form metal plugs first, planarize or smoothen them next with respect to the surface of the insulating layer and then deposit metal layer to make contact with the via plugs and then subtractively etch as before to form the required "personalized" wiring layer.

In forming wiring layers, blanket metal must be patterned. Photolithography is a common approach wherein patterned layers are usually formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The exposed resist may be rendered soluble (positive resist) and be washed away, or insoluble (negative resist) and fix the pattern. In either case, the remaining resist on the surface forms the desired pattern.

Etching of metal lines require precise lithographic processes. The nature of the mask used for etching can affect the lithographic process itself. Thus, when photoresist is used as the mask, its local thickness can vary depending upon the underlying features that it crosses on the substrate. If it crosses a step, for example, then its thickness over the top of the step will be much thinner than that which crosses over low-lying regions. During lithographic exposure, either the thin resist becomes overexposed, or the thicker resist underexposed. Upon development, a resist pattern crossing a step will therefore exhibit a linewidth variation (i.e., narrower on the top of the step). For lines in which step heights approach the size of the linewidth, as would be the case with submicron technologies of ULSI, such variations in dimension can become unacceptable. Also, the thickness of the resist may be governed by other factors as well. For example, a photolithographic equipment, such as an G-line stepper might specify a resolution of 0.7 $\mu$m. On the other hand, its depth of focus may be no more than 1 $\mu$m. To achieve step coverage and satisfy the requirements of an etching process that does not exhibit extremely high selectivity, a resist layer may have to be 1.5 thick, with the result that the specified resolution of 0.7 $\mu$m cannot be achieved.

This tradeoff between the depth of focus on the one hand and step coverage/selectivity on the other hand can be avoided by utilizing phase-shifting mask as disclosed by Leroux in U.S. Pat. No. 5,407,785. In the same patent, ultra-small equal-width lines and spaces are generated on an integrated circuit wafer using multiple exposure and phase-shifting at the wafer level. In particular, as shown in FIG. 1a, an integrated circuit wafer (10) is coated with a layer of photoresist (20) and then masked using a mask (30) defining a pattern of multiple feature lines arranged at a regular line pitch. The layer of photoresist is then underexposed (40) so as to partially bleach portions of the layer of photoresist in accordance with the pattern. Next, the mask and the integrated circuit wafer are positionally translated, or shifted (50) relative to one another by a predetermined fraction of the line pitch, and the layer of photoresist is then again underexposed. Developing the photoresist layer creates a stepped profile (25). The layer of photoresist is then blanket exposed (45), the stepped profile causing exposure in the vicinity of steps to be retarded. The layer of photoresist is then developed, producing thin lines of photoresist separated by substantially equal spaces of no photoresist.

Jeng, et al., in U.S. Pat. No. 5,741,624 also disclose a method using a phase shift mask for improved resolution in a semiconductor interconnect process. A semiconductor wafer having a first layer and overlying insulating layer receives a photoresist layer. A first photoresist area is exposed to light having a first dosage, while a second, adjacent photoresist area is concurrently exposed to light having a second dosage. The first area and second area then are concurrently developed to partially expose the photoresist layer. The partial exposure removes photoresist within the first area to one depth and within the second area to a second depth. The second depth differs from the first depth. In one embodiment, the second depth extend through the photoresist down to the insulating layer. After subsequently performing a contact and/or trench etch through the exposed insulating layer and removing excess photoresist above the insulating layer, conductive material is deposited in the contact/trench opening and over the insulating layer. The result is an upper conductive layer coupled to the first layer via a contact or other conductive connection.

Garofalo, et al., show a phase shift mask in U.S. Pat. No. 5,308,721 used to form a step pattern in a photoresist layer utilizing one exposure. The photoresist layer is developed to form a multi-step opening. The multi-step opening shape is then transferred to the underlying layer using etch steps. Ulrich, on the other hand, discloses a multiple exposure masking system in U.S. Pat. No. 5,753,417, for forming multi-level resist profiles as applied to a dual damascene process. A refractory metal capped dual damascene interconnect is disclosed by Cote, et al., in U.S. Pat. No. 5,262,354 where contrast enhanced photolithography is used. Another method of producing interconnects in a semiconductor device is shown by Okazaki, et al., in U.S. Pat. No. 4,31,984. Here, that region of a resist film in which a contact is to be formed and that regions thereof in which an interconnection is to be formed are respectively irradiated with an electron beam in a dose substantially equal to an optimum dose of the resist film and in a dose less than the optimum dose. Thereafter, the resist film is developed. By performing dry etching, an opening extending to a substrate is provided in the region in which the contact is to be formed, and the surface of an insulating film overlying the substrate is exposed in the region in which the interconnection is to be formed. After depositing a conductive metal film on the whole surface the remaining resist film is removed together with the metal film deposited thereon, whereby the contact and the interconnection are formed.

Not using a mask, and being able to "write" directly on the surface to be patterned would of course be a much preferred method inasmuch as the attendant problems of precise transferring image from one mask to another, and the registration of one mask with respect to the other would be alleviated. As is known in the art, electron beam lithography provides such a capability by using a focused electron beam. Such beams can readily be scanned and accurately positioned on a semiconductor substrate to expose radiation-sensitive resist (e-beam resist). That is, e-beam lithography provides the ability to produce submicron features directly on a substrate, without the use of a mask, under the control of a computer. Though quite slow in throughput (and more expensive) when compared to optical projection and step and repeat systems, it is becoming more and more necessary to use e-beam lithography as the minimum feature size of critical dimension of the ultra scale integration exceeds the limitation of optical methods. What is needed is a judicious use of the e-beam technology in order to realize the high potential of especially the highly miniaturized interconnects of the ultra scale integrated circuit technology as disclosed in the embodiments of this invention.

SUMMARY OF THE INVENTION

It is therefore an object of this invention to provide a method of employing e-beam lithography in the forming of high resolution step profiles required in submicron technology.

It is still another object of the present invention to provide a method of employing e-beam direct writing of photoresist in the forming of dual damascene structures into dielectric layers of a semiconductor substrate.

These objects are accomplished by providing a semiconductor substrate having a substructure of devices, and layers formed thereon; forming a first dielectric layer over said substructure; forming a nitride layer as an etch-stop layer over said first dielectric layer; forming a second dielectric layer over said nitride layer; forming a photoresist layer over said nitride layer; e-beam patterning said photoresist layer with a plurality of profiles having at least a single and a double step-profile, said double step-profile further comprising a top portion and a bottom portion; developing and baking said photoresist layer to form said plurality of profiles into said photoresist layer; etching said bottom portion of said double step-profile into said first dielectric layer and breaking through the underlying nitride layer; etching further said bottom portion of said double step-profile into said first dielectric layer; dry etching said photoresist layer to transfer said top portion of said double step-profile and said single step-profile to the bottom of said photoresist layer; transferring said top portion of said double step-profile and said single step-profile into underlying said first dielectric layer and stopping on said nitride layer; and resist stripping and cleaning said substrate to complete the transfer of said e-beam patterned plurality of profiles into said dielectric layers.

In another embodiment, these objects are further accomplished by forming a dual damascene structure employing the disclosed method of electron beam application.

BRIEF DESCRIPTION OF THE DRAWINGS

FIG. 1a is a partial cross-sectional view of a semiconductor substrate showing the exposing of a photoresist layer employing the conventional optical methods of prior art.

FIG. 1b is a partial cross-sectional view of a semiconductor substrate showing the second conventional exposure of the photoresist layer of FIG. 1a after the shifting of the substrate by a predetermined amount to form a patterned photoresist layer according to prior art.

FIG. 1c is a partial cross-sectional view of a semiconductor substrate showing the forming of a stair-case pattern resulting from the development of the substrate of FIG. 1b, according to prior art.

FIG. 1d is a partial cross-sectional view of a semiconductor substrate showing the blanket exposure of the substrate of FIG. 1c, according to prior art.

FIG. 1e is a partial cross-sectional view of a semiconductor substrate showing the forming of thin resist line pattern as a result of using mask shifting and multiple exposure of prior art.

FIG. 2a is a partial cross-sectional view of a semiconductor substrate showing the forming of an electron radiation sensitive resist over a substrate, according to this invention.

FIG. 2b is a partial cross-sectional view of a semiconductor substrate showing the e-beam writing of the step-profiles of this invention into the e-beam resist of FIG. 2a.

DESCRIPTION OF THE PREFERRED EMBODIMENTS

Figure 2B:
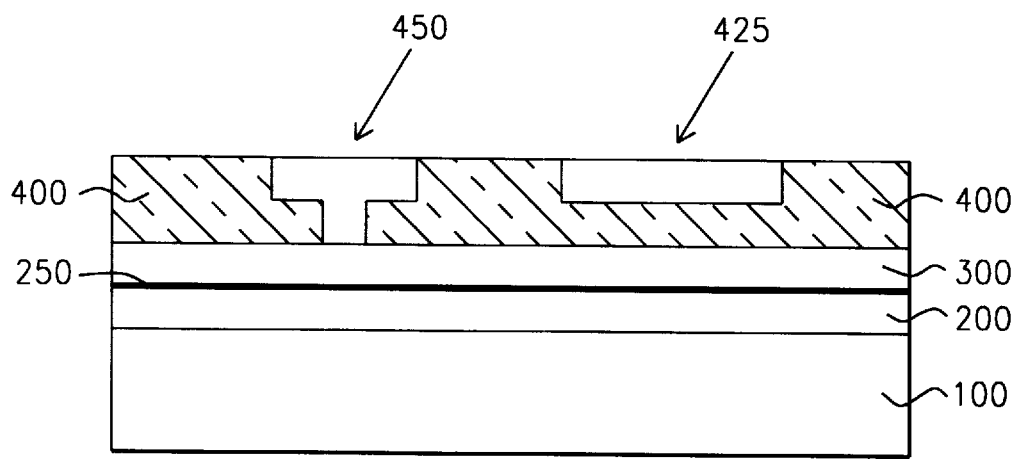

Referring now to FIGS. 2a–2h, there is shown a method of forming step-profiles in dielectric materials. Step-profiles refer to stair-case-like structures that may have a plurality of steps, and the present method is not limited to plurality of steps, and the present method is not limited to a single or double step-profile, such as, for example, found in single or dual damascene structures. A modified e-beam dual damascene process will be used to disclose the methods of the present invention.

Briefly, and as is know in the art, damascene process is a process for inlaying metal into holes or grooves formed in a substrate. In its simplest form, this process starts with an insulating layer which is first formed on a substrate. Then, the insulating layer is coated with a photoresist layer which is exposed through a first mask with the image pattern of a contact or a via hole. After the exposure and development of the resist layer, the hole pattern in the photoresist layer is anisotropically etched into the upper portion of the insulating layer. The photoresist is next exposed through a second mask having a groove image pattern of the conductive lines, after being aligned with the first mask pattern to encompass the contact or via hole openings. After a similar second process of exposure and development of the photoresist layer, the grooves are anisotropically etched into the upper portion of the insulating layer, while the hole openings already present in the upper insulating layer are simultaneously etched and replicated in the lower portion of the insulating materiel. Thus, a dual damascene, or a two-step-profile structure is formed in the insulating layer. After the etching is complete, both the contact/via holes and the line grooves are filled with metal. Finally, the substrate is subjected to chemical mechanical polishing until excess metal is removed and the underlying insulating material is reached and the substrate surface, which is now inlaid with metal, is planarized for further processing.

It will be known to those skilled in the art that in the conventional dual damascene process, the various masking steps can introduce optical errors due to diffraction and diffusions of light through the mask. Furthermore, registration of, for example, the via pattern mask with respect to the line mask can introduce additional positional errors which together will cause distortions in the transferred images from their original patterns. Thus, in FIGS. 2a–2h, electron beam will be used to form step-profiles including a single step-profile and a double step-profile where the profiles are "written" by scanning a focused electron beam under the control of a computer.

In FIG. 2a, a semiconductor substrate (100) is provided with a substructure of devices formed in the substrate and/or metal layers thereof. As the substructure itself is not significant to the invention, it is not described in detail in order not to unnecessarily obscure the present invention. It will be understood by those skilled in the art that contacts are formed in an interlevel dielectric layer in which the contacts provide connections between a source-drain, salicide or polysilicon to a metal layer, while vias are formed within upper dielectric layers where the vias provide interconnections between metal layers. Thus, the horizontal metal layers containing line patterns and the metal plugs in the vertical contacts and vias spanning the metal layers, together, form the interconnections between the devices in a semiconductor substrate.

The layer (200) overlying the substructure of the embodiment shown in FIG. 2a is a dielectric. Forming dielectric layers is known in the art. Blanket dielectric layers may be formed from materials including but not limited to silicon oxide materials, silicon nitride materials, and silicon oxynitrides materials formed within integrated circuits through methods including but not limited to CVD, PECVD, PVD sputtering methods. For the preferred embodiment of the present invention, the first blanket dielectric layer (200) is preferably formed of a dielectric material chosen from the group of dielectric materials consisting of silicon oxide dielectric materials, silicon nitride, and silicon oxynitride. Preferably, the first blanket dielectric layer comprises PECVD oxide having a thickness between about 6000 to 8000 Å.

Next, nitride layer (250) is formed over first dielectric layer (200) as shown in FIG. 2a. Nitride is preferably formed by reacting dichlorosilane ($SiCl_2H_2$) with ammonia ($NH_3$) in an LPCVD at a pressure between about 0.3 to 0.4 torr, temperature between about 650 to 780° C. and at flow rates between about 300 to 600 sccm. It is also preferred that the thickness of nitride layer (200) is between about 200 to 400 Å, which is used as an etch-stop layer. Next, a second dielectric layer (300) is formed over the nitride layer (250) to a thickness between about 6000 to 8000 Å.

At the next step, a layer of radiation sensitive resist (400) is formed over nitride layer (300) to a thickness between about 8,000 to 12,000 Å. Preferably, it comprises O-Dichlorobenzene (ZEP 520), and it is made by Nippon Zeon. A main feature and key aspect of the present invention is the use of a scanning electron beam machine to form the required patterns into the electron radiation sensitive material. It will be appreciated that not using a mask, and being able to "write" directly on the surface to be patterned, in this case layer (400) in FIG. 2a, is a much preferred method inasmuch as the attendant problems of transferring image from one conventional mask to another, and the registration of one mask with respect to the other is alleviated. As is known in the art, electron beam lithography provides such a capability by using a focused electron beam. An electron beam (not shown) is scanned and accurately positioned on substrate to expose radiation-sensitive resist, or e-beam resist (400) shown in FIG. 2a.

FIG. 2b shows the image profiles that are scanned into the e-beam resist of this invention. For illustrative purposes, a single step-profile (425) and a two step-profile (450) pattern are shown in FIG. 2b. It will be appreciated that any multi-step-profile may be scanned into the e-beam resist layer (400) shown in FIG. 2b. The data needed to expose the e-beam resist to the e-beam radiation may be computer generated, or may be in the form of lookup tables based on computations and/or experiments. The data provides the dosage levels that are needed to expose the e-beam resist based on the pattern features. Thus, for a single step-profile, the dosage and the dwell time of the e-beam will be different for a two step-profile. It will be apparent that the dwell time (and also the dosage level, depending upon the particular scheme that is being used) to expose the bottom portion of the two step-profile (450) will be longer than the time required to expose the top portion of the same profile, or the single step-profile (425) shown in FIG. 2b. It should also be noted that the e-beam data is also compensated for, what is known as proximity effect. Briefly, electrons that penetrate the e-beam resist travel further down to underlying layers and then get scattered back, which then affect the exposure of the overlying resist. The forward scatter as well as the back scatter of electrons are also affected by the pattern or the proximity of the features, hence the proximity effect. Therefore, it is important that the data is compensated for the back scattering energy as well as proximity effects so that the total e-beam dosage is at correct levels to provide undistorted images. The absolute correct dosage levels for different step-profiles can be calculated before-hand, or experimentally determined off-line prior to committing to the manufacturing line. It will be noted that e-beam lithography is especially suited for step-profiles because there is no problem of registration of one feature (e.g., a hole) with respect to another one(e.g., a groove) as the various step heights are radiated into the e-beam resist continuously at each beam spot. Thus, the conventional optical resolution of the order of about one micron can be improved to about 0.375 $\mu$m with the presently disclosed e-beam application to forming of step-profiles.

Figure 2C:
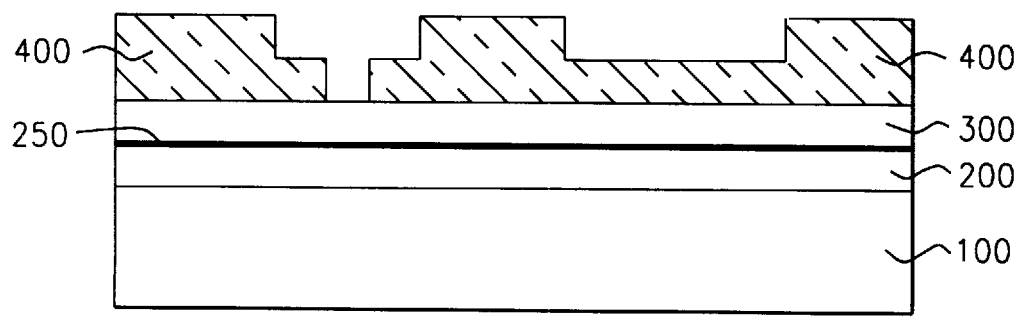
FIG. 2c is a partial cross-sectional view of a semiconductor substrate showing the forming of step-profiles into the e-beam resist of this invention.
Figure 2D:
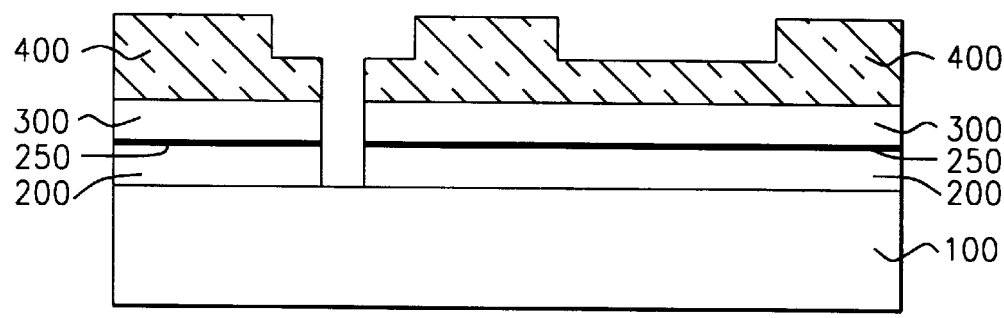
FIG. 2d is a partial cross-sectional view of a semiconductor-substrate showing the etching of the bottom portion of a step-profile into the underlying layers of this invention.

After the exposure of the e-beam resist layer (400) with electron beam machine (not shown), the resist is developed using solution ZED500 (Diethylmalonate+Diethylketone). Subsequently, the resist is baked at a temperature between about 90 to 120° C. thus forming profiles (425) and (450) as shown in FIG. 2c. At the next step shown in FIG. 2d, first the bottom portion of the two step-profile is etched into the exposed second dielectric layer (300) and break through nitride layer (250) using an etch recipe comprising $C_4F_8+CO+O_2+Ar$ and $CHF_3+CO$ gases. This is followed by etching the now exposed oxide layer (200) until substrate (100) is reached with a recipe also comprising $C_4F_8+CO+O_2+Ar$ gases.

Figure 2E:
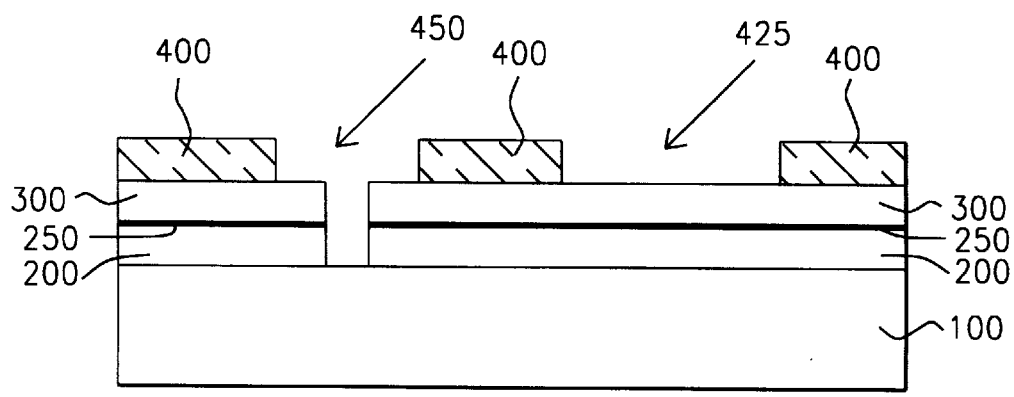
FIG. 2e is a partial cross-sectional view of a semiconductor substrate showing the transfer of portions of step-profiles of this invention to the lower portions of the e-beam resist of this invention.
Figure 2F:
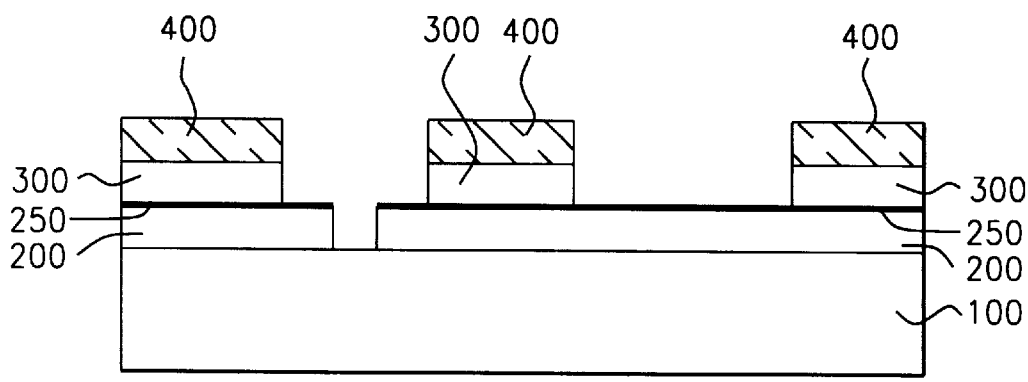
FIG. 2f is a partial cross-sectional view of a semiconductor substrate showing the transfer of portions of step-profiles in the e-beam resist into the underlying layer, according to this invention.
Figure 2G:
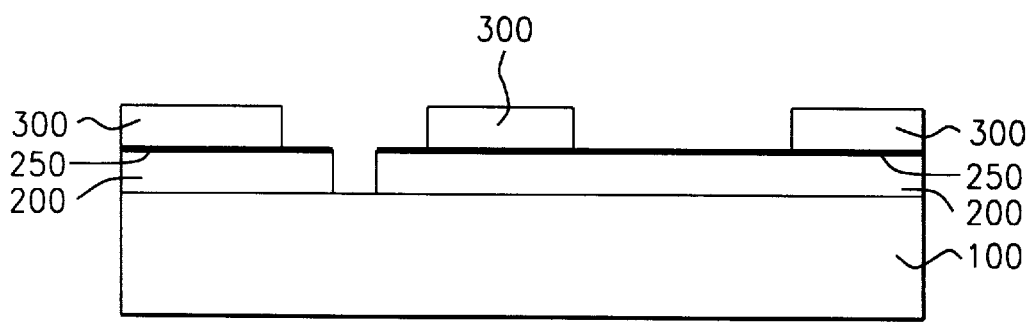
FIG. 2g shows the substrate of FIG. 2f after the removal of the e-beam resist of this invention.
Figure 2H:
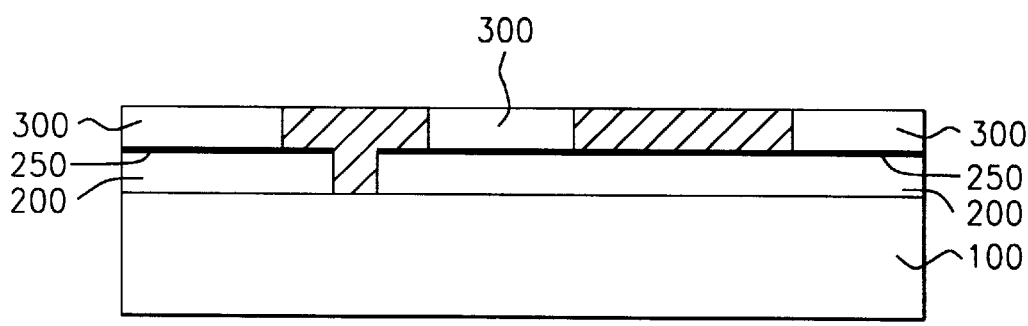
FIG. 2h shows the filling of the e-beam step-profile structure of this invention, and planarization of the same in preparation for the subsequent process steps in the manufacture of semiconductor devices according to this invention.

Next, oxygen plasma dry etching is used to etch the e-beam resist until the top portion of the two step-profile (450) is etched until nitride layer (300) is reached while at the same time the single step-profile (425) is also etched to reach the same nitride layer as shown in FIG. 2e. Further etching with a recipe comprising $C_4F_8+CO+O_2+Ar$ gases transfers the profile in the e-beam resist into the nitride layer as shown in FIG. 2f. After having transferred the step-profiles into the nitride and dielectric layers, the e-beam resist is removed as shown in FIG. 2g. As a final step, the single and two step-profile structures are filled with metal, thus forming interconnects in the semiconductor substrate, excess metal removed by chemical-mechanical polishing and the substrate readied for subsequent semiconductor manufacturing processes as shown in FIG. 2h.

Though various details of the disclosed method are set forth here to provide an understanding of the present invention, it will be obvious, however, to those skilled in the art that these specific details need not be employed to practice the present invention. For example, an etch stop layer may be used between step layers. At the same time, it will be evident that the same methods may be employed in other similar process steps such as in forming dual damascene structures. Furthermore, the method may be employed in forming step-profiles for filling vias with polysilicon in forming poysilicon lines for intralevel connections, or for filling contact or via holes with metal in forming metal lines for interlevel connections in semiconductor devices.

That is, while the invention has been particularly shown and described with reference to the preferred embodiments thereof, it will be understood by those skilled in the art that various changes in form and details may be made without departing from the spirit and scope of the invention.

What is claimed is:

1. A method of forming a direct e-beam step profile comprising the steps of:
   providing a semiconductor substrate having a substructure of devices, and layers formed thereon;
   forming a first dielectric layer over said substructure;
   forming an etch-stop nitride layer over said first dielectric layer;
   forming a second dielectric layer over said nitride layer;
   forming a photoresist layer over said second dielectric layer;
   direct e-beam writing said photoresist layer with a plurality of profiles having at least a single and a double step-profile, said double step-profile further comprising a top portion and a bottom portion wherein said top and bottom portions can have differing dimensions from each other;
   developing and baking said photoresist layer to form said plurality of profiles into said photoresist layer;
   etching said bottom portion of said double step-profile into said second dielectric layer and said nitride layer;
   etching further said bottom portion of said double step-profile into said second dielectric layer;
   dry etching said photoresist layer to transfer said top portion of said double step-profile and said single step-profile to the bottom of said photoresist layer;
   transferring said top portion of said double step-profile and said single step-profile into underlying said second dielectric layer and said nitride layer; and
   resist stripping and cleaning said substrate to complete the transfer of said direct e-beam writing plurality of profiles into said first and second dielectric layers.

2. The method of claim 1, wherein said semiconductor substrate is silicon.

3. The method of claim 1, wherein said first dielectric layer is PECVD oxide having a thickness between about 6000 to 8000 Å.

4. The method of claim 1, wherein said nitride layer has a thickness between about 200 to 400 Å.

5. The method of claim 1, wherein said second dielectric layer is PECVD oxide having a thickness between about 6000 to 8000 Å.

6. The method of claim 1, wherein said photoresist is sensitive to electron radiation and comprises O-Dichlorobenzene (ZEP520).

7. The method of claim 1, wherein said photoresist layer has a thickness between about 8000 to 1200 Å.

8. The method of claim 1, wherein said direct e-beam writing said photoresist layer with a plurality of profiles is accomplished with a scanning e-beam machine without using a mask.

9. The method of claim 1, wherein said developing said photoresist is accomplished with a solution comprising diethylmalonate+diethyl ketone.

10. The method of claim 1, wherein said baking said photoresist layer is accomplished at a temperature between about 90 to 120° C.

11. The method of claim 1, wherein said etching said bottom portion of said double step-profile into said second dielectric layer and said nitride layer is accomplished with a recipe comprising $C_4F_8+CO+O_2+Ar$ and $CHF_3+CO$ gases.

12. The method of claim 1, wherein said etching further said bottom portion of said double step-profile into said first dielectric layer is accomplished with a recipe comprising recipe comprising $C_4F_8+CO+O_2+Ar$ gases.

13. The method of claim 1, wherein said dry etching said photoresist layer to transfer said top portion of said double step-profile and said single step profile to the bottom of said photoresist layer is accomplished by performing oxygen plasma ashing.

14. The method of claim 1, wherein said transferring said top portion of said double step-profile and said single step-profile into second dielectric layer and underlying said nitride layer is accomplished with an etch recipe comprising $C_4F_8+CO+O_2+Ar$ gases.

15. The method of claim 1, wherein said resist stripping and cleaning said substrate is accomplished by using solution $H_2SO_4+NH_4OH+H_2O_2$.

16. A method of forming a direct e-beam dual damascene structure comprising the steps of:

providing a semiconductor substrate having a substructure of devices, and layers formed thereon;

forming a first dielectric layer over said substructure;

forming an etch-stop nitride layer over said dielectric layer;

forming a second dielectric layer over said nitride layer;

forming a photoresist layer over said second dielectric layer;

direct e-beam writing said photoresist layer with a dual damascene profile having an upper groove portion and a lower hole portion wherein said upper and lower portions can have differing dimensions from each other;

developing and baking said photoresist layer to form said dual damascene profile into said photoresist layer;

etching said lower hole portion of said dual damascene profile into said second dielectric layer and breaking through said nitride layer;

etching further said lower hole portion of said dual damascene profile into said second dielectric layer;

dry etching said photoresist layer to transfer said upper groove portion of said dual damascene profile to the bottom of said photoresist layer;

transferring said upper groove portion of said dual damascene profile into underlying said second dielectric layer and stopping on said nitride layer; and resist stripping and cleaning said substrate to complete the transfer of said said direct e-beam writing dual damascene profile into said nitride and dielectric layers.

17. The method of claim 16, wherein said semiconductor substrate is silicon.

18. The method of claim 16, wherein said dielectric layer is PECVD oxide having a thickness between about 6000 to 8000 Å.

19. The method of claim 16, wherein said nitride layer has a thickness between about 200 to 400 Å.

20. The method of claim 16, wherein said photoresist is sensitive to electron radiation and comprises O-Dichlorobenzene (ZEP520).

21. The method of claim 16, wherein said photoresist layer has a thickness between about 8000 to 12000 angstroms (Å).

22. The method of claim 16, wherein said direct e-beam writing said photoresist layer with a dual damascene profile is accomplished with a scanning e-beam machine without using a mask.

23. The method of claim 16, wherein said developing said photoresist is accomplished with a solution comprising diethylmalonate+diethyl ketone.

24. The method of claim 16, wherein said baking said photoresist layer is accomplished at a temperature between about 90 to 120° C.

25. The method of claim 16, wherein said etching said lower hole portion of said dual damascene into said second dielectric layer and breaking through said nitride layer is accomplished with a recipe comprising $C_4F_8+CO+O_2+Ar$ and $CHF_3+CO$ gases.

26. The method of claim 16, wherein said etching further said lower hole portion of said dual damascene into said second dielectric layer is accomplished with a recipe comprising $C_4F_8+CO+O_2+Ar$.

27. The method of claim 16, wherein said dry etching said photoresist to transfer said upper groove portion of said dual damascene profile to the bottom of said photoresist layer is accomplished by performing oxygen plasma ashing.

28. The method of claim 16, wherein said transferring said upper groove portion of said dual damascene profile into said second dielectric layer and stopping on underlying said nitride layer is accomplished with an etch recipe comprising $C_4F_8+CO+O_2+Ar$.

29. The method of claim 16, wherein said resist stripping and cleaning said substrate is accomplished by using oxygen plasma ashing.

* * * * *